United States Patent [19]

Weiner et al.

[11] Patent Number: 4,947,062

[45] Date of Patent: Aug. 7, 1990

[54] DOUBLE BALANCED MIXING

[75] Inventors: Scott M. Weiner; Donald A. Neuf, both of Wantagh; Steven J. Spohrer, Kings Park, all of N.Y.

[73] Assignee: Adams Russell Electronics Co., Inc., Waltham, Mass.

[21] Appl. No.: 196,040

[22] Filed: May 19, 1988

[51] Int. Cl.$^5$ .......................... G06G 7/00; H03B 19/00
[52] U.S. Cl. .................................. 307/529; 328/156; 328/15; 307/219.1; 307/271
[58] Field of Search .................. 333/218; 328/156, 15, 328/160; 329/166, 50, 163; 307/529, 219.1, 271; 455/137, 189; 363/159; 332/24, 43 R; 357/22

[56] References Cited

U.S. PATENT DOCUMENTS

| | | | |
|---|---|---|---|
| 3,424,990 | 1/1969 | Escobosa | 328/160 |
| 3,723,910 | 3/1973 | Cannon | 329/50 |
| 4,104,672 | 8/1978 | Di Lorenzo et al. | 357/15 |
| 4,387,439 | 6/1983 | Lin | 328/160 |
| 4,569,119 | 2/1986 | Terada et al. | 357/15 |
| 4,728,819 | 3/1988 | Vu | 307/571 |

OTHER PUBLICATIONS

S. A. Maas, "A GaAs MESFET Mixer with Very Low Intermodulation", IEEE Transactions on Microwave Theory and Techniques, Apr. 1987, vol. MTT-35, No. 4, pp. 425-429.
S. A. Maas, "A GaAs MESFET Balanced Mixer with Very Low Intermodulation", 1987 IEEE MTT-S International Microwave Symposium Digest, vol. 11, Jun. 1987, pp. 895-898.
K. Kanazawa et al., "A GaAs Double-Balanced Dual-Gate FET Mixer IC for UHF Receiver Front-End Applications", IEEE Transactions on Microwave Theory and Techniques, Dec. 1985, vol. MTT-33, No. 12, pp. 1548-1554.
E. Oxner, "Junction FETs in Active Double-Balanced Mixers", Siliconix Inc. Application Note, Jun. 1973, pp. 1-16.
S. A. Maas, Microwave Mixers, 1986, pp. 301-309.
E. Oxner, "Designing a Super-High Dynamic Range Double-Balanced Mixer", Siliconix Application Note, Oct. 1986, pp. 1-15.

Primary Examiner—Andrew J. James
Assistant Examiner—Richard Roseen
Attorney, Agent, or Firm—Fish & Richardson

[57] ABSTRACT

A double balanced mixer comprising a plurality of transistors, each transistor being adapted to operate in the microwave frequency range and including an input electrode, a control electrode, and an output electrode, the transistors being arranged in a ring configuration with the control electrodes of a first pair of the transistors being interconnected and the control electrodes of a second pair of the transistors being interconnected; circuitry for coupling an input signal having a frequency within a predetermined frequency band in the microwave frequency range to the input electrodes of the ring of transistors and for producing a 180° relative phase difference between the input signal applied to the input electrodes of first transistors of the first and second pairs of transistors and the input signal applied to the input electrodes of second transistors of the first and second pairs of transistors; circuitry for coupling a local oscillator signal to the control electrodes of the ring of transistors and for producing a 180° relative phase difference between the local oscillator signal applied to the control electrodes of the first pair of transistors and the local oscillator signal applied to the control electrodes of the second pair of transistors; and circuitry for biasing the plurality of transistors in their linear operating regions; whereby the ring of transistors produces at the output electrodes an output signal having a frequency which is a function of the frequencies of the input signal and the local oscillator signal for input signals within the predetermined frequency band.

43 Claims, 5 Drawing Sheets

DOUBLE BALANCED MIXING

BACKGROUND OF THE INVENTION

This invention relates to double balanced mixing at microwave frequencies.

In many microwave front end circuits, a number of microwave signals received by a system antenna are applied to a mixer, such as a Schottky diode mixer, for down-conversion to intermediate frequency (IF) signals. Along with the fundamental IF frequencies, the mixer typically generates intermodulation products due to the nonlinearity of response of the Schottky diodes. Third order intermodulation products, for example, are quite close in frequency to the fundamental IF frequencies and therefore are difficult to remove by filtering. Ideally, the dynamic range of the mixer (i.e., the maximum received signal power at which mixer is designed to be used) is delimited by the 1 dB compression point. However, the dynamic range is restricted if the third order intercept ($IP_3$) point, which is the lowest received signal power level at which the power level of a third order product equals the power level of a fundamental IF signal, occurs below the 1 dB compression point.

Maas, in "A GaAs MESFET Mixer with Very Low Intermodulation", *IEEE Transaction on Microwave Theory Techniques*, Vol. MTT-35, No. 4, April, 1987, pp 425-29, and "A GaAs MESFET Balanced Mixer with a Very Low Intermodulation", *IEEE MTT-S International Microwave Symposium Digest*, Vol. II, 1987, pp 895-98, shows single ended and single balanced mixing using the channel of a common-source, GaAs MESFET (metal electrode semiconductor field effect transistor) as the mixing element. The local oscillator (LO) is applied to the gate electrode with a bias voltage and the microwave input signal ("RF") is coupled to the drain electrode. The IF signal is extracted from the drain electrode with a filter. The LO energy leaking across the drain to source terminals of the MESFET is short circuited so that the MESFET operates in its linear (i.e., unsaturated) region, thereby minimizing intermodulation distortion. Thus, a high third order intercept is achieved at microwave operating frequencies in the range of 10 GHz and with bandwidths of about 500 MHz. But because the RF and IF signals both appear at the drain electrode, the RF and IF frequency bands cannot overlap.

Double balanced mixers, on the other hand, internally isolate the RF and IF signals, and thus permit the RF and IF frequency bandwidths to overlap. Conventional double balanced mixers operating in the UHF frequency band (e.g., from 100 MHz to 800 MHz), constructed as a ring of silicon MOSFETs or JFETs, achieve high intermodulation suppression and concomitant high third order intercept. However, relatively high gate-to-drain and gate-to-source capacitances typically limit the upper operating frequency of MOSFET and JFET mixers to below the microwave frequency range (i.e., the frequency range from about 1 GHz to about 30 GHz).

SUMMARY OF THE INVENTION

A general feature of the invention is a double balanced mixer comprising a plurality of transistors, each transistor being adapted to operate in the microwave frequency range and including an input electrode, a control electrode, and an output electrode, the transistors being arranged in a ring configuration with the control electrodes of a first pair of the transistors being interconnected and the control electrodes of a second pair of the transistors being interconnected; circuitry for coupling an input signal having a frequency within a predetermined frequency band in the microwave frequency range to the input electrodes of the ring of transistors and for producing a 180° relative phase difference between the input signal applied to the input electrodes of first transistors of the first and second pairs of transistors and the input signal applied to the input electrodes of second transistors of the first and second pairs of transistors; circuitry for coupling a local oscillator signal to the control electrodes of the ring of transistors and for producing a 180° relative phase difference between the local oscillator signal applied to the control electrodes of the first pair of transistors and the local oscillator signal applied to the control electrodes of the second pair of transistors; and circuitry for biasing the plurality of transistors in their linear operating regions; whereby the ring of transistors produces at the output electrodes an output signal having a frequency which is a function of the frequencies of the input signal and the local oscillator signal for input signals within the predetermined frequency band.

The microwave transistors are preferably metal electrode semiconductor field effect transistors (MESFETs). However, metal insulator semiconductor field effect transistors (MISFETs) or high electron mobility transistors (HEMTs) may be used instead.

Because the MESFETs are biased in their linear operating regions, intermodulation distortion on the output (i.e., IF) signal is reduced. Specifically, the power levels of third order products are significantly decreased so that the third order intercept point ($IP_3$) is increased and maintained substantially higher than the mixer's 1 dB compression point over the operating bandwidth of the mixer. Thus, third order products have a reduced effect on the mixer's dynamic range.

The ring configuration permits the IF signal to be extracted from MESFET electrodes (e.g., source electrodes) that are different from the electrodes to which the RF signal is applied (e.g., drain electrodes), eliminating the need for a diplexer (filter) to separate the RF and IF signals at a single MESFET electrode and thus allowing the RF and IF signal bands to overlap. The MESFET ring is also highly symmetrical with respect to the RF and IF signals. That is, the output (source) electrodes from which the IF signal is extracted lie on a virtual short circuit plane as seen from the input (drain) electrodes across which the RF signal is applied; the converse is also true. As a result, the isolation between IF and RF signal ports is increased.

One aspect of the invention features transforming the input signal from an unbalanced signal to a balanced signal using a balun, coupling a first component of the balanced input signal to the input electrodes of the first MESFETs, and coupling a second component of the balanced input signal, 180° out of phase with the first component, to the input electrodes of the second MESFETs; an LO balun transforms the local oscillator signal from an unbalanced signal to a balanced signal, couples a first component of the balanced LO signal to the control electrodes of the first pair of MESFETs, and couples a second component of the balanced LO signal, 180° out of phase with the first component, to the control electrodes of the second pair of MESFETs. The baluns maintain the respective 180° phase differences between the input signal components and between the LO signal components over the predetermined input signal frequency band (e.g., from 2 GHz to 12 GHz). This permits the mixer to be used with relatively low conversion loss and VSWR.

Preferred embodiments include the following features. The baluns comprise a strip transmission line having a first strip conductor separated from a second strip conductor by a dielectric substrate; each balun provides equal path lengths from a corresponding signal port to the appropriate electrodes of the corresponding MESFETs. The first end of the first strip conductor is coupled to the signal port and receives the unbalanced signal; the first strip conductor divides into a pair of conductors at a junction region for coupling the components of the signal to the MESFETs. The first end of the second strip conductor is coupled to a reference (e.g., ground) potential at the signal port and the second strip conductor splits into a pair of conductors, aligned with the pair of conductors of the first strip conductor, at a junction region for coupling the components of the signal to the MESFETs.

To reduce input VSWR, the first and second strip conductors are arranged to maintain a predetermined impedance along the strip transmission line between the first ends and the junction regions thereof. Preferably, impedance is maintained constant by providing the first strip conductor with a first, substantially constant width between its first end and its junction region, and providing the second strip conductor with a second, greater width at its first end which tapers (e.g., exponentially) to the first width at its junction region. The pairs of conductors of said first and second strip conductors are arranged to provide a second impedance between the junction regions and the input electrodes of the MESFETs that is matched to an input impedance at the electrodes of the MESFETs to further reduce input VSWR.

The first pair of MESFETs are located adjacent opposite planar surfaces of the LO balun strip transmission line, as are the second pair of MESFETs. A first one of the pair of conductors of the first strip conductor and a first one of the pair of conductors of the second strip conductor are aligned and disposed in a first plane, and a second one of the pair of conductors of the first strip conductor and a second one of the pair of conductors of the second strip conductor are aligned and disposed in a second plane different from (e.g., orthogonal to) the first plane. This allows equal length connections to be made to the control electrodes of the pairs of MESFETs (thereby maintaining the 180° phase shift between LO signal components) despite their locations in opposite planes.

In another aspect of the invention, the output electrode of the first MESFET of the first pair of MESFETs is coupled to the output electrode of the second MESFET of the second pair of MESFETs and to a third terminal, and the output electrode of the second MESFET of the first pair of MESFETs is coupled to the output electrode of the first MESFET of the second pair of MESFETs at a fourth terminal. The output signal is produced as a balanced signal across the third and fourth terminals, and the balanced signal is transformed (such as by a discrete transformer) to an unbalanced output signal and coupled to an output port. The transforming and coupling circuitry has a first impedance at the output electrodes of the MESFETs matched to an output impedance of the MESFETs (thereby reducing VSWR), and the first impedance is transformed to a second impedance at the output port.

In a preferred embodiment, the control electrodes of the transistors are gate electrodes. In one embodiment, the input electrodes are drain electrodes and the output electrodes are source electrodes. In another, the input electrodes are source electrodes and the output electrodes are drain electrodes.

Each transistor may be constructed to space its gate electrode equally between its source electrode and its drain electrode. This minimizes the amount of the LO signal that leaks through to the RF and IF circuits by making the gate-to source capacitance and gate-to drain capacitance of the transistors equal. As a result, LO to RF isolation and LO to IF isolation are further improved.

In another feature of the invention, the biasing circuitry comprises part of the circuitry for coupling the local oscillator signal to the control electrodes of the ring of MESFETs. Preferably, the biasing circuitry includes discrete capacitors connected in series in the LO balun for forming a bias circuit with the inductance of the balun to derive a bias level for the MESFETs from the LO signal. Alternatively, separate biasing circuitry derives the bias voltage independently of the LO signal power and couples the bias to the output (source) electrodes of the MESFETs via a center tap on a winding of the output signal transformer. The MESFETs are prevented from developing a DC current at their input electrodes in response to the biasing of the MESFETs, preferably by discrete capacitors connected in series with the input balun to block DC current.

Other features and advantages of the invention will be apparent from the following description of the preferred embodiments, and from the claims.

DESCRIPTION OF THE PREFERRED EMBODIMENTS

We first briefly describe the drawings.

STRUCTURE AND OPERATION

Figure 1:
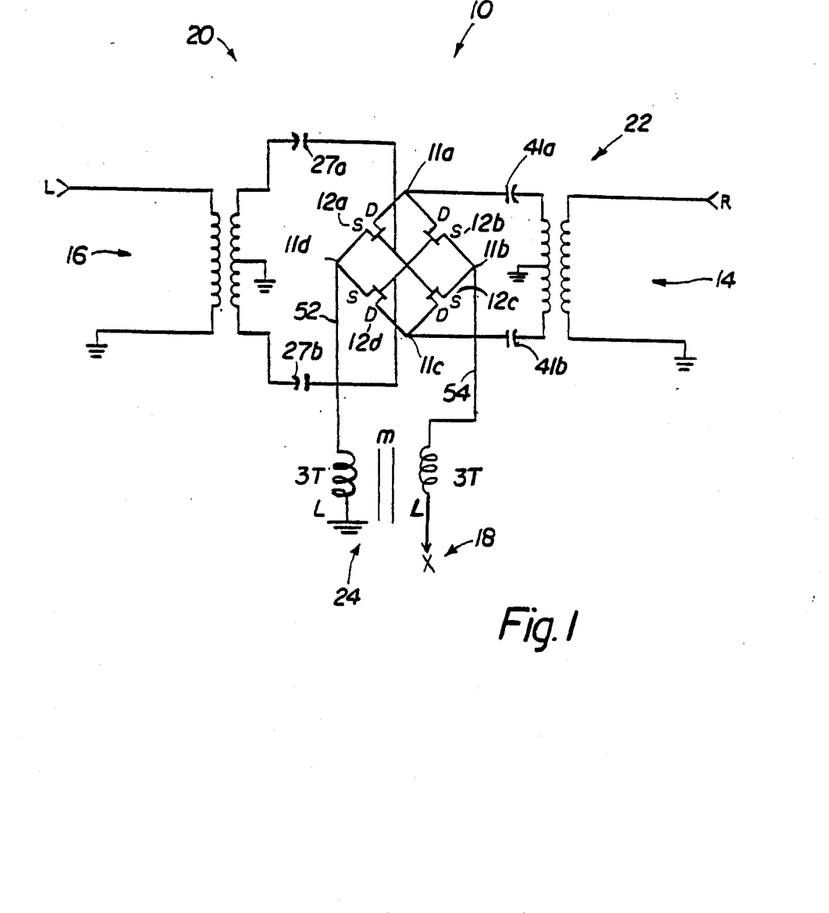
FIG. 1 is a schematic diagram of a low frequency equivalent circuit of the double balanced mixer of the invention.

Referring to FIG. 1, double balanced microwave mixer 10 comprises a plurality of transistors 12a–12d adapted to operate in the microwave frequency range and electrically arranged in a ring configuration discussed in detail below. Transistors 12a–12d are preferably MESFETs, but may alternately be MISFETs or HEMTs. MESFETs 12a–12d mix one or more microwave signals coupled to RF port 14 (e.g., from an antenna, not shown) with a local oscillator (L.O.) signal applied to L.O. port 16 and produce the resultant intermediate frequency (IF) signal or signals at IF (i.e., X) port 18. As discussed in detail below, mixer 10 is constructed to operate over a wide band of input microwave signals (e.g., from 2 GHz to 12 GHz) and to produce IF signals over a broad frequency range (e.g., from 10 MHz to 2 GHz), while maintaining a third order intercept point (IP$_3$) above the 1 dB compression point of mixer 10 over the input frequency range.

The gate electrodes of MESFETs 12a, 12c are connected together, as are the gate electrodes of MESFETs 12b, 12d. LO port 16 is coupled to the pairs of gate electrodes via balun (balanced/unbalanced line) 20, which serves to transform an unbalanced LO signal at port 16 to a balanced signal having components 180° out of phase at the gate electrodes of MESFETs 12a, 12c and MESFETs 12b, 12d, respectively. Balun 20 also transforms an input impedance of, e.g., 50 ohms, at LO port 16 to a 100 ohm impedance at the gate electrodes to more effectively match the gate impedance of MESFETs 12a–12d and reduce VSWR.

The drain electrodes of MESFETs 12a, 12b are connected together at terminal 11a, and the drain electrodes of MESFETs 12c, 12d are interconnected at terminal 11c. Terminals 11a, 11c are fed by input microwave signals from RF port 14 via balun 22. Balun 22 transforms an unbalanced signal at port 14 to a pair of balanced signals which are 180° out of phase at terminals 11a, 11c respectively. Balun 22 also transforms the input impedance (e.g., 50 ohms) of RF port 14 to approximately 100 ohms at the MESFET drain electrodes, again to match the input impedance of the MESFETs and reduce VSWR.

The source electrodes of MESFETs 12b, 12c are electrically interconnected at terminal 11b, as are the source electrodes of MESFETs 12a, 12d at terminal 11d. The IF signals are produced across the pairs of source electrodes and thus appear as balanced signals having components 180° out of phase at terminals 11b, 11d. The balanced IF signals are transformed to unbalanced signals at IF (X) port 18 by transformer 24, which also reduces the output impedance (e.g., 100 ohms) of the MESFETs to an impedance of, e.g., 50 ohms, at IF port 18.

Figure 2:
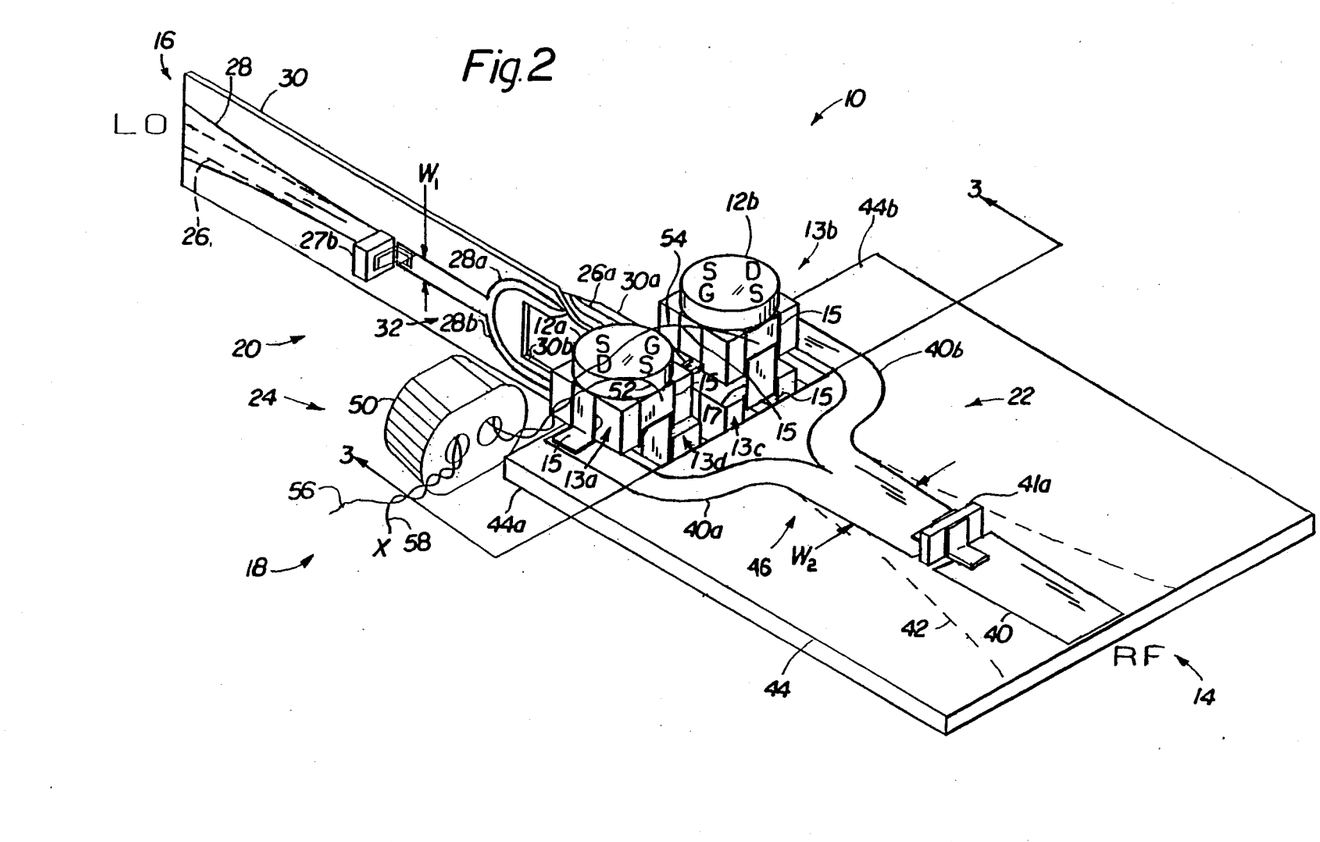
FIG. 2 is a perspective view of the mixer of FIG. 1.
Figure 3:
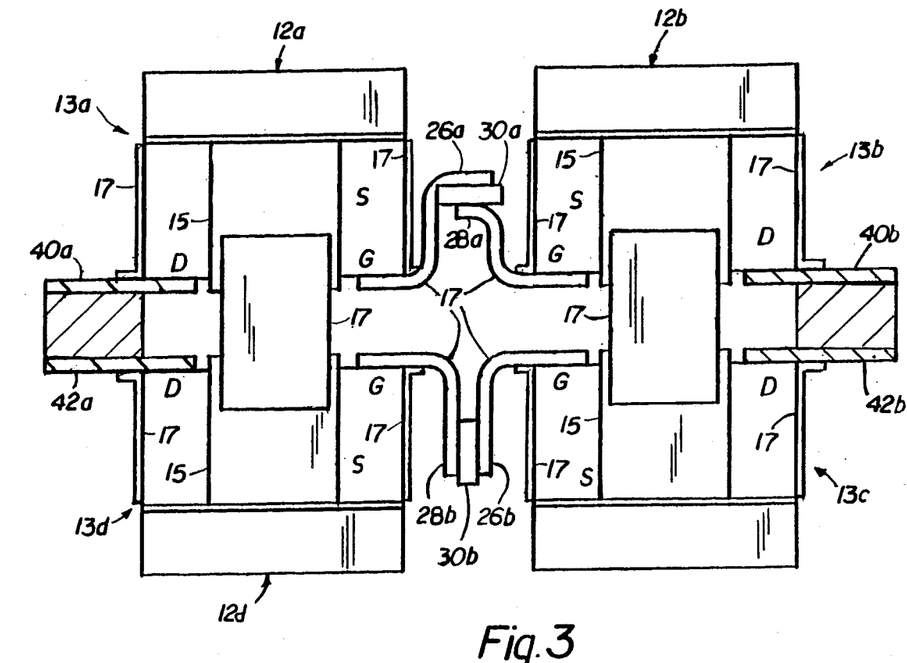
FIG. 3 is a plan view of a portion of the mixer of FIG. 2 taken along line 3—3.

Referring also to FIGS. 2 and 3, MESFETs 12a–12d are GaAs devices supplied by NEC (part No. NE900089) and are disposed in blocks 13a–13d of insulating material having conductive strips 15 etched thereon to provide interconnection to the gate, source, and drain electrodes. Each MESFET 12a–12d is supplied with a pair of source electrode terminals S to allow multiple connections to be made to the source to reduce inductance. Blocks 13a, 13d are secured closely spaced together by jumper strips 17 (only one of which is shown in FIGS. 2 and 3) which electrically interconnect both pairs of source electrodes of MESFETs 12a, 12d. A similar pair of jumpers 17 interconnects the source electrode pairs of MESFETs 12b, 12c and secures blocks 13b, 13c together.

As shown in FIG. 2, MESFETs 12a–12d are physically arranged so that the interconnections (i.e., jumpers 17) between the source electrodes of MESFETs 12a, 12d do not face the interconnections between the source electrode of MESFETs 12b, 12c. This significantly reduces the stray capacitance between the source electrodes of MESFETs 12a, 12d and the source electrodes of MESFETS 12b, 12c (i.e., the points where the IF signal is extracted—FIG. 1), thereby allowing the upper end of the operating bandwidth to be increased.

Balun 20 is represented electrically by a transformer having a secondary winding with a grounded center tap (FIG. 1) to transform an unbalanced signal applied to the primary winding (i.e., at LO port 16) to a balanced signal having components 180° out of phase across its secondary winding (and applied to the gate electrodes of MESFETs 12a, 12c and 12b, 12d, respectively). Balun 22 is implemented as a forked microstrip transmission line which includes a pair of ½ oz. copper strip conductors 26, 28 rolled onto the opposite planar surfaces of a 0.005 inch thick insulating substrate 30, for example, RT/Duroid TM 5870, manufactured by Rogers Corp. of Chandler, Ariz., having a dielectric constant of 2.33. Strip conductors 26, 28 and substrate 30 are aligned and form a 50 ohm microstrip transmission line between LO port 16 and junction region 32, where strip conductors 26, 28 each split into a pair of strip conductors 26a, 26b and 28a, 28b, respectively. Strip conductors 26a, 28a are aligned on opposite sides of a finger region 30a of substrate 30 and form a 100 ohm transmission line; likewise, strip conductors 26b, 28b form a second 100 ohm transmission line on substrate finger 30b.

Substrate 30 is disposed on its side and fingers 30a, 30b are located between the gate electrode connections of MESFETs 12a, 12b and MESFETs 12c, 12d, respectively. Strip conductors 26a, 26b are connected (via jumpers 17 and conductor strips 15) to the gate electrodes of MESFETs 12a, 12c, respectively, to electrically connect the gate electrodes together (FIG. 1) and to strip conductor 26. Likewise, the gate electrodes of MESFETs 12b, 12d are connected together and to strip conductor 28 via interconnection with strip conductors 28a, 28b, respectively. It is important to note that because MESFETs 12a, 12d are mounted together and MESFETs 12b, 12c are secured together (to reduce the lengths of the source interconnections between them) the gate electrodes of MESFETs 12a, 12c are not disposed in the same plane (nor are the gate electrodes of MESFETs 12b, 12d). To maintain the lengths of the transmission lines between junction regions 32 and the gate electrodes of all MESFETs 12a–12d equal, substrate finger 30a is "twisted" to lie in a plane orthogonal to that in which finger 30b and the remainder of substrate 30 are disposed. Thus, the lengths of strip conductors 26a, 26b between junction region 32 and the gate electrodes of MESFETs 12a, 12c are equal and match the lengths of strip conductors 28a, 28b between junction region 32 and the gate electrodes of MESFETs 12b, 12d. This insures that the 180° phase difference between the LO signal components applied to MESFETs 12a, 12c and 12b, 12d will be maintained to a very high frequency and over a broad frequency range.

Strip conductor 28 is connected to a reference (i.e., ground) potential at unbalanced LO port 16, and the unbalanced LO signal is applied to strip conductor 26. Strip conductor 26 is of substantially constant thickness $W_1$ from between LO port 16 and junction region 32, but is narrowed very slightly in the immediate area of LO port 16 to provide a 50 ohm input impedance at LO port 16. Strip conductor 28 tapers exponentially, however, from a maximum width of approximately 4.5 $W_1$ at LO port 16 to approximately the width of strip conductor 26 at junction region 32. This maintains a constant, 50 ohm impedance from LO port 16 to junction region 32 while the LO signal is being transformed from an unbalanced signal to a balanced signal.

A pair of discrete 5.6 pF capacitors 27a, 27b are connected in series with strip conductors 26, 28 between LO port 16 and junction region 32. Capacitors 27a, 27b provide, along with the inductance of transforming balun 20 (FIG. 1), a self-biasing circuit for the gate-to-source junctions of MESFETs 12a–12d, as described in detail below.

Balun 22 is also represented electrically by a transformer having a grounded secondary winding center tap (FIG. 1) and is implemented a microstrip transmission line that includes ½ oz. copper strip conductors 40, 42 rolled onto opposite sides of a planar substrate 44 of insulating material (e.g., RT/Duroid 5870). Substrate 44 is approximately 0.02 inches thick. Strip conductor 40 extends from RF port 14 (where it receives the unbalanced microwave signal) to a junction region 46, where conductor 40 splits into a pair of strip conductors 40a, 40b. The width $W_2$ of strip conductor 40 is substantially constant between RF port 14 and junction region 46 but is slightly narrower at port 14 than at junction region 46 to produce a 50 ohm input impedance at RF port 14. Discrete capacitor 41a (50 pF) is disposed in series with strip conductor 40 (see FIG. 1).

Strip conductor 42 is aligned with conductor 40 but tapers exponentially in width from a maximum of approximately 4.5 $W_2$ at RF port 14 (where strip conductor is connected to ground potential) to substantially the same width as strip conductor 40 at junction region 46. There, strip conductor 46 splits into a pair of strip conductors 42a, 42b, of substantially constant width, aligned under strip conductors 40a, 40b, respectively. The exponential taper of strip conductor 42 provides a constant 50 ohm impedance from RF port 14 to junction region 46. Discrete 50 pF capacitor 41b is connected in series with strip conductor 42 between RF port 16 and junction region 46. Discrete capacitors 41a, 41b prevent MESFETs 12a–12d from drawing DC drain current.

Strip conductors 40, 42 and substrate 44 form a 50 ohm microstrip transmission line between RF port 14 and junction region 46 to transform the unbalanced RF signal to a balanced signal, having components shifted in phase by 180°, at junctions 46 of strip conductors 40, 42. The 50 ohm transmission line branches into a pair of 100 ohm transmission lines at junction region 46. One line includes strip conductors 40a, 42a separated by substrate finger 44a and extends adjacent MESFET blocks 13a, 13d. Strip conductors 40a, 42a are connected to the drain electrodes of respective MESFETs 12a, 12d (via jumpers 17 and strips 15). The other 100 ohm transmission line, which includes strip conductors 40b, 42b disposed on substrate finger 44b, extends adjacent to blocks 13b, 13c. Strip conductor 40b is connected to the drain electrode of MESFET 12b (thereby coupling the drain electrodes of MESFETs 12a, 12b together) and strip conductor 42b is connected to the drain electrode of MESFET 12c (thereby interconnecting the drain electrodes of MESFETs 12c, 12d).

Transformer 24 is a discrete device which includes a ferrite core 50 wound with 3 turns (3T) of #36 AWG bifilar wire on both the primary and secondary windings. One side of the primary and secondary windings are connected via a pair of such wires 52, 54 to the junctions between the source electrodes of MESFETs 12a, 12d and 12b, 12c, respectively (see FIG. 1), by soldering the wires to the source electrode conductor strips 15 of blocks 13a, 13b. The other side of the primary and secondary windings are connected by wires 56, 58 to IF port 18. Because IF port 18 is an unbalanced port, wire 58 is connected to ground potential; the unbalanced IF signal appears on wire 56. In order for transformer 24 to provide the necessary balanced/unbalanced signal transformation and impedance matching over the operating bandwidth of mixer 10, it has been found that its mutual inductance (M) should approximately equal the self inductances (L) of the windings; also, the reactance of each winding should exceed 50 ohms over the bandwidth.

Mixer 10 is mounted in an electrically conductive package (not shown) and RF, LO, and IF ports 14, 16, 18 are connected to conventional microwave connectors, such as type SMA connectors manufactured by Omni-Spectra of Waltham, MA (e.g., part no. 2058-5305-02).

In operation, the one or more received microwave signals are applied to RF port 14 as signals referenced to ground potential (i.e., as unbalanced signals). The input RF signals have a power level of, for example, up to +19 dBm (the 1 dB compression point of mixer 10). The in-phase component of each RF signal (balanced by balun 22) is coupled to the drain electrodes of MESFETs 12a, 12b by strip conductors 40a, 40b, respectively, while the 180° out of phase component is applied, via respective strip conductors 42, 40b, to the drain electrodes of MESFETs 12c, 12d.

The local oscillator signal is also referenced to ground at LO port 16. LO signal power ranges from, for example, +19 dBm to +23 dBm and is selected to optimize one or more operating characteristics of mixer 10 (e.g., third order intercept). The in-phase component of the balanced LO signal is applied via strip conductors 26a, 26b to the gate electrodes of MESFETs 12a, 12c, respectively, and the gate electrodes of MESFETs 12b, 12d are fed by the 180° out of phase LO component via strip conductors 28a, 28b, respectively, as discussed.

Capacitors 27a, 27b form, along with the inductance of balun 20 (see FIG. 1), a self-biasing circuit for MESFETs 12a–12d to apply a DC voltage to the gate electrodes which biases MESFETs 12a–12d at a level determined by the LO power. For example, an LO power of +20 dBm yields about −2 volts DC at the gate electrodes, reverse biasing the gate-to-source junctions of MESFETs 12a–12d just above pinch-off. Because capacitors 41a, 41b prohibit DC drain current, the DC drain to source voltage (VDS) of each MESFET 12a–12d is zero. The DC operating points of MESFETs 12a–12d are therefore located at the origins of their current-voltage characteristics and MESFETs 12a–12d operate in their linear regions as voltage controlled resistors between drain and source. The conductance of the drain-source channel of MESFETs 12a–12d is controlled by the instantaneous voltage applied to their gate electrodes by the LO signal. For example, during the first (positive) half of a sinusoidal LO cycle, the voltage applied to the gate electrodes of MESFETs 12a, 12c is increased, causing the drain-to-source resistances of MESFETs 12a, 12c to become very low (about 9 ohms), providing a low impedance path for the RF signal to propagate to IF port 18 via MESFETs 12a, 12c. At the same time, the voltage applied to the gate electrodes of the other pair of MESFETs 12b, 12d is decreased (due to the 180° phase shift of the LO signal component applied to those gate electrodes), driving MESFETs 12a, 12b into pinch-off. This causes the source-to-drain channels of MESFETs 12b, 12d to appear substantially as open-circuits to the RF signal.

The opposite occurs during the second, negative half of the sinusoidal LO signal cycle. That is, the gate voltage of MESFETs 12b, 12d is increased by the LO signal to produce a low drain-to-source resistances for MESFETs 12b, 12d, while the drain-to-source resistances of MESFETs 12a, 12c are driven very high by the instantaneous decrease in the gate voltage of MESFETs 12a, 12c. Thus, the RF signal is coupled through a low impedance path via MESFETs 12b, 12d to IF port 18.

The IF signal generated in this manner is a balanced signal having a pair of components 180° out of phase with each other, which are applied to transformer 24 from terminals 11b, 11d (FIG. 1). The signal components are combined by discrete transformer 24 to produce an unbalanced IF signal, referenced to ground potential at an impedance of, e.g., 50 ohms, at IF (X) port 18.

The IF signals applied to transformer 24 as a result of the mixing process provided by MESFETs 12a–12d have, of course, several frequency components. For example, for a first microwave signal, $RF_1$, a pair of fundamental IF signals having frequencies of $RF_1 \pm LO$ are generated. A second microwave signal ($RF_2$) applied to RF port 14 will cause mixer 10 to generate a second pair of fundamental IF signal frequencies of $RF_2 \pm LO$. MESFETs 12a–12d also produce intermodulation products between the two microwave signals and the LO signal. One intermodulation product is a third order product having a frequency component of, for example, $2RF_2-RF_1-LO$, which may be very close in frequency to one of the fundamental IF frequencies for $RF_1$ (i.e., $RF_1-LO$). However, because the LO controlled channel resistance of MESFETs 12a–12d is highly linear due to the operation of MESFETs 12a–12d in their linear operating regions, the power level of the intermodulation products, such as the third order product, is significantly reduced.

Figure 4:
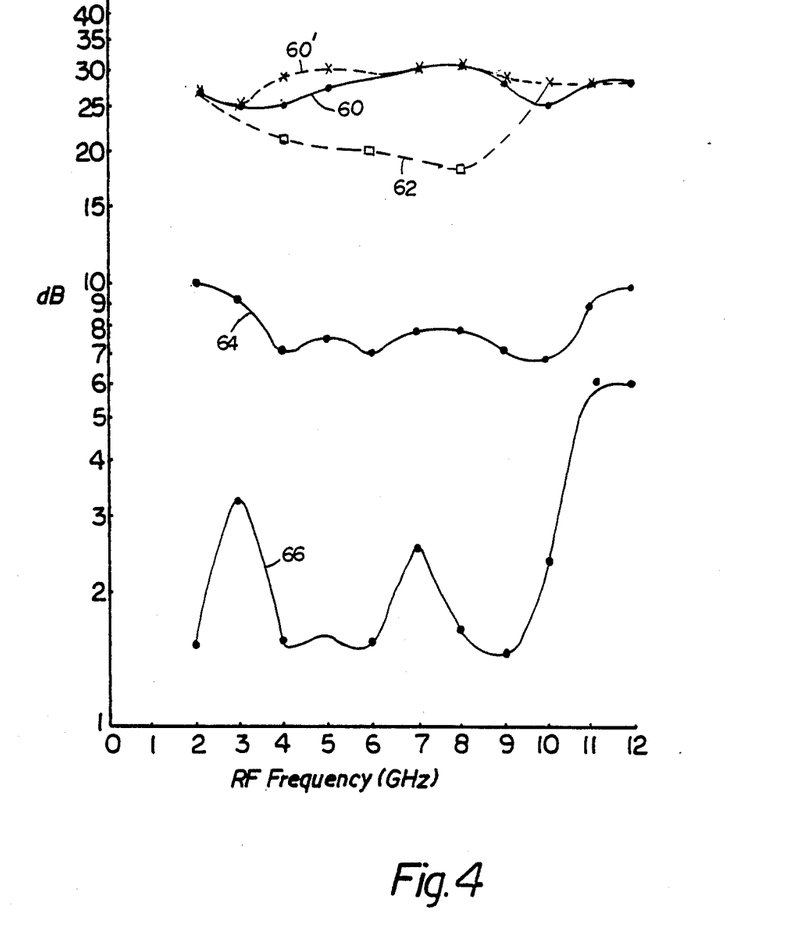
FIG. 4 are curves of performance characteristics of the mixer of FIGS. 1 and 2.

Referring also to FIG. 4, curve 60 shows the third order intercept point $IP_3$ (i.e., the lowest RF signal power at which the power levels of a third order product and a fundamental IF signal are equal) provided by mixer 10 over an RF input frequency range of 2 GHz to 12 GHz for an LO power of +20 dBm. As shown, $IP_3$ varies from a minimum of approximately +25 dBm to a maximum level of greater than +30 dBm. Curve 60' illustrates slightly improved $IP_3$ (between 3 GHz and 6 GHz and between 9 GHz and 11 GHz) when LO power is increased to +23 dBm. As discussed above, mixer 10 has a 1 dB compression point (which represents the typical maximum RF input power level for mixer 10) of approximately +19 dBm. Thus, over the entire operating frequency range of mixer 10, the third order intercept point is maintained substantially higher than the highest input microwave signal power level that would be applied to mixer 10 during normal operation.

Because MESFETs 12a–12d are arranged in a ring configuration with the RF input applied across the interconnected pairs of drain electrodes, allowing the IF to be extracted across the source electrode pairs, mixer 10 does not require a diplexer (filter) to separate the IF and RF signals. Thus, the frequency bands of the IF and RF signals are permitted to overlap (although the bands do not overlap in mixer 10 due to the use of discrete transformer 24). The ring configuration is also symmetrical with respect to the RF and IF signals. That is, as seen from across the drain electrodes, the source electrodes of MESFETs 12a–12d lie on a virtual short circuit plane; the drain electrodes of MESFETs 12a–12d also lie on a virtual short circuit plane as seen across the source electrodes. Thus, the RF voltage that leaks across transistor pair 12a, 12b equals that which leaks across MESFET pair 12c, 12d, thereby increasing the RF to IF isolation of mixer 10.

The isolation between the LO and RF ports 16, 14 and between the LO and IF ports 16, 18 is also enhanced due to the symmetry of the MESFET ring configuration. For example, curve 62 (FIG. 4) illustrates that the isolation provided between LO port 16 and RF port 14 over the 2 GHz to 12 GHz band is between 18 dB and 28 dB. This is because the portions of the LO signal that leak through MESFETs 12a–12d to terminals 11a and 11c are equal in magnitude and phase. So too are the portions of the LO signal that are passed via MESFETs 12a–12d to terminals 11b, 11d. Thus, the components are substantially cancelled at RF port 14 and IF port 18 by the 180° phase shifts provided by baluns 22, 24, respectively.

The symmetry of the ring of MESFETs 12a–12d additionally provides separation between even order products (such as the fundamental IF frequencies), which appear across the source electrodes, and odd order products (e.g., image and RF signals), which appear across the drain electrodes.

Baluns 20, 22 and transformer 24 provide the unbalanced/balanced signal transformation and impedance transformation over the entire 2 GHz to 12 GHz operating band. This produces a relatively low conversion loss (curve 64, FIG. 4), for example, between 7 dB and 10 dB across the band. The impedance matching also provides good VSWR characteristics over the band. For example, the VSWR at RF port 14 is maintained between about 1.5:1 and slightly greater than 3:1 between 2 GHz and 9 GHz, as shown by curve 66 in FIG. 4. RF VSWR rises to about 6:1 between 9 GHz and 12 GHz due to parasitics introduced by MESFET packages 13a–13d (FIG. 3).

Other embodiments are within the following claims.

Figure 5:
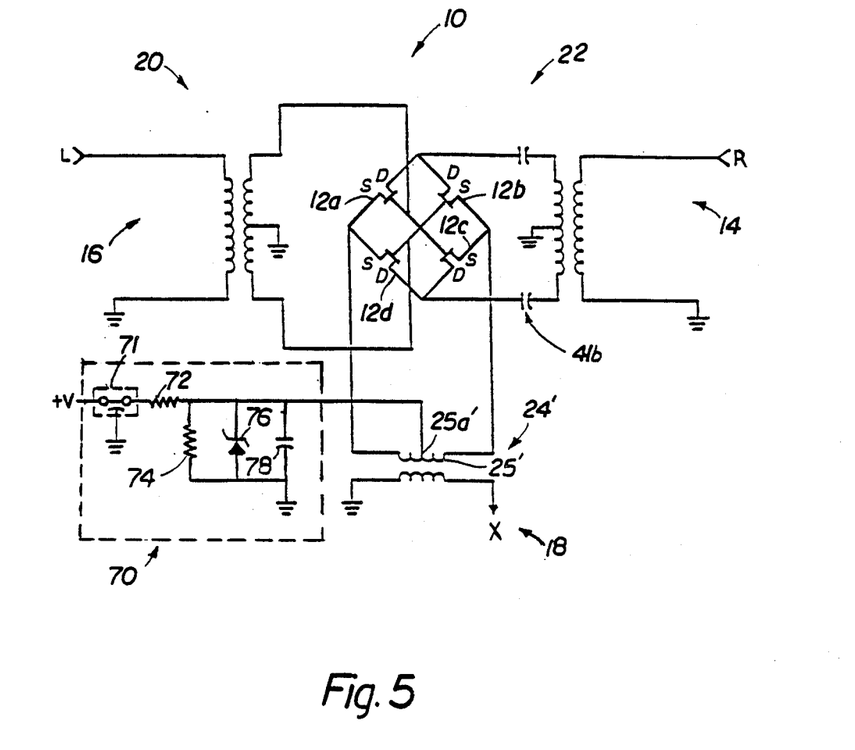
FIG. 5 is a schematic diagram of a low frequency equivalent circuit of a double balanced mixer according to a second embodiment of the invention.

Referring to FIG. 5, mixer 10 may alternatively be provided with a bias network 70 for controlling the DC bias of the ring of MESFETs 12a–12d independently of the power of the LO signal. A positive reference voltage +V is applied (via RFI filter 71) through a voltage divider network consisting of resistors 72, 74 and coupled to the center tap 25a' on the primary winding 25' of transformer 24' (which replaces transformer 24—FIG. 1). Transformer 24' is a discrete device having a ferrite core wound with a 3-turn primary and secondary windings (using #36 AWG trifilar wire). The self and mutual inductances of transformer 24' conform to the same design rules as those discussed above for transformer 24.

The positive DC bias voltage is applied to the source electrodes of MESFETs 12a–12d via primary winding 25'. Capacitors 27a, 27b (FIG. 1) are omitted from LO balun 20, allowing the gate electrodes to be DC coupled to ground. Thus, the positive voltage applied by bias network 70 reverse biases the gate to-source junctions of MESFETs 12a–12d at DC. By varying reference voltage +V, the DC operating points of MESFETs 12a–12d can be selectively controlled to optimize a desired mixer characteristic (e.g., $IP_3$). With the DC operating point established by bias network 70, LO power can be reduced, for example, to below +19 dB, without degrading $IP_3$.

Zener diode 76 in bias network 70 provides bias voltage regulation and also prevents the gate-to-source junctions of MESFETs 12a–12d from becoming forward biased in case the reference voltage becomes negative. Capacitor 78 AC bypasses the center tap 25' of the transformer 24' to ground (thereby allowing transformer 24' to transform the unbalanced IF signal applied from MESFETs 12a–12d to a balanced signal referenced to 50 ohms impedance at IF (X) port 18).

The ring of MESFETs 12a–12d may alternatively be fabricated as a monolithic integrated circuit rather than from discrete MESFETs. This would reduce the size of the ring, thereby lowering lead inductances and permitting the frequency range of mixer 10 to be extended. The monolithic MESFETs may also be constructed to physically center their gate electrodes between their source and drain electrodes. In discrete MESFETs, the gate electrode is normally offset closer to the source electrode than to the drain electrode so that when the transistor is biased, the gate to source capacitance ($C_{gs}$) is typically several times greater than the gate-to drain capacitance ($C_{gd}$). By physically centering the gate electrode, $C_{gs}$ and $C_{gd}$ are maintained equal when the MESFET is biased (e.g., either by the LO signal or by bias network 70). This minimizes the amount of the LO signal that leaks through the MESFETs to the drain and source circuits, thereby increasing the isolation between the LO and RF ports and the LO and IF ports. Also, centering the gate electrodes allows the RF signal to be applied instead to the source electrodes of the MESFET ring and the IF signal to be extracted from the drain electrodes with substantially the same performance characteristics as those obtained by applying the RF signal to the drain electrodes and extracting the IF signal from the source electrodes.

Additionally, other designs for baluns 20, 22, and transformer 24 may be used. For example, a strip transmission line balun may be substituted for discrete transformer 24. Using a strip transmission line to couple the IF signals from MESFETs 12a–12d would allow the upper end of the IF band to be increased above 2 GHz to overlap with the RF band.

I claim:

1. A double balanced mixer comprising
   a plurality of transistors, each transistor being adapted to operate in the microwave frequency range and including an input electrode, a control electrode, and an output electrode, each said transistor being constructed to space its control electrode equally between its input electrode and its output electrode, said plurality of transistors being arranged in a ring configuration with the control electrodes of a first pair of said transistors being interconnected and the control electrodes of a second pair of said transistors being interconnected,
   circuitry for coupling an input signal having a frequency within a predetermined frequency band in the microwave frequency range to the input electrodes of said ring of transistors and for producing a 180° relative phase difference between the input signal applied to the input electrodes of first transistors of the first and second pairs of transistors and the input signal applied to the input electrodes of second transistors of the first and second pairs of transistors,
   circuitry for coupling a local oscillator signal to the control electrodes of said ring of transistors and for producing a 180° relative phase difference between the local oscillator signal applied to the control electrodes of said first pair of transistors and the local oscillator signal applied to the control electrodes of said second pair of transistors,
   circuitry for applying a predetermined electrical potential to at least one of the control, input, or output electrodes of each one of said transistors to bias the plurality of transistors in their linear operating regions,
   whereby said ring of transistors produces at said output electrodes an output signal having a frequency which is a function of the frequencies of the input signal and the local oscillator signal for input signals within the predetermined frequency band, and
   circuitry for coupling said output signal from said output electrodes to an output port.

2. The mixer of claim 1 further comprising an input port adapted to receive the input signal as an unbalanced input signal, and wherein said input signal coupling circuitry comprises
   circuitry for transforming the unbalanced input signal to a balanced signal and for coupling a first component of the balanced input signal to said input electrodes of said first transistors, and for coupling a second component of the balanced input signal, 180° out of phase with the first component, to said input electrodes of said second transistors.

3. The mixer of claim 2 wherein said transforming and coupling circuitry comprises circuitry for maintaining the 180° phase difference between the first and second input signal components over said predetermined input signal frequency band.

4. The mixer of claim 3 wherein said predetermined input signal frequency band is greater than one octave.

5. The mixer of claim 4 wherein said predetermined input signal frequency band is from 2 GHz to 12 GHz.

6. A double balanced mixer comprising
   a plurality of transistors, each transistor being adapted to operate in the microwave frequency range and including an input electrode, a control electrode, and an output electrode, said plurality of transistors being arranged in a ring configuration with the control electrodes of a first pair of said transistors being interconnected and the control electrodes of a second pair of said transistors being interconnected,
   circuitry for coupling an input signal having a frequency within a predetermined frequency band in the microwave frequency range to the input electrodes of said ring of transistors and for producing a 180° relative phase difference between the input signal applied to the input electrodes of first transistors of the first and second pairs of transistors and the input signal applied to the input electrodes of second transistors of the first and second pairs of transistors,
   circuitry for coupling a local oscillator signal to the control electrodes of said ring of transistors and for producing a 180° relative phase difference between the local oscillator signal applied to the control electrodes of said first pair of transistors and the local oscillator signal applied to the control electrodes of said second pair of transistors,
   circuitry for applying a predetermined electrical potential to at least one of the control, input, or output electrodes of each one of said transistors to bias the plurality of transistors in their linear operating regions, and
   an input port adapted to receive the input signal as an unbalanced input signal,
   said input signal coupling circuitry including circuitry for transforming the unbalanced input signal to a balanced signal and for coupling a first component of the balanced input signal to said input electrodes of said first transistors, and for coupling a second component of the balanced input signal 180° out of phase with the first component, to said input electrodes of said second transistors, said transforming and coupling circuitry including circuitry for maintaining the 180° phase difference between the first and second input signal components over said predetermined input signal frequency band, whereby said ring of transistors produces at said output electrodes an output signal having a frequency which is a function of the frequencies of the input signal and the local oscillator signal for input signals within the predetermined frequency band, and circuitry for coupling said output signal from said output electrodes to an output port.

7. The mixer of claim 6 wherein said first strip conductor comprises a first end coupled to said input port and adapted to receive said unbalanced input signal and a junction region at which said first strip conductor divides into a pair of conductors for coupling the first component of the input signal to the input electrode of the first transistor of the first pair of transistors and the input electrode of the first transistor of the second pair of transistors, respectively.

8. The mixer of claim 7 wherein said second strip conductor comprises a first end coupled to a reference potential at said input port and a junction region at which said second strip conductor splits into a pair of conductors, aligned with said pair of conductors of the first strip conductor, for coupling the second component of the input signal to the input electrode of the second transistor of the first pair of transistors and the input electrode of the second transistor of the second pair of transistors, respectively.

9. The mixer of claim 8 wherein said first and second strip conductors are arranged to maintain a predetermined impedance along said strip transmission line between the first ends of the first and second strip conductors and the junction regions of said first and second strip conductors.

10. The mixer of claim 9 wherein said first strip conductor has a first, substantially constant width between its first end and its junction region, and said second strip conductor has a second, greater width at its first end and is tapered to the first width at its junction region to maintain said predetermined impedance between said first ends and said junction regions.

11. The mixer of claim 10 wherein the width of said second strip conductor is tapered along an exponential curve between its first end and its junction region.

12. The mixer of claim 9 wherein the pairs of conductors of said first and second strip conductors are arranged to provide a second impedance between said junction regions of said first and second strip conductors and the input electrodes of said transistors, said second impedance being matched to an input impedance at the input electrodes of said transistors.

13. The mixer of claim 1 further comprising a local oscillator port adapted to receive the local oscillator signal as an unbalanced local oscillator signal, and wherein said local oscillator signal coupling circuitry comprises circuitry for transforming the unbalanced local oscillator signal to a balanced signal and for coupling a first component of said balanced local oscillator signal to the control electrodes of said first pair of transistors and a second component of said balanced local oscillator signal, 180° out of phase with the first component, to the control electrodes of said second pair of transistors.

14. The mixer of claim 13 wherein said transforming and coupling circuitry comprises circuitry for maintaining the 180° phase difference between the first and second local oscillator signal components over a predetermined local oscillator signal frequency band.

15. The mixer of claim 14 wherein said predetermined local oscillator signal frequency band is greater than one octave.

16. The mixer of claim 15 wherein said predetermined local oscillator signal frequency band is from 2 GHz to 12 GHz 17. A double balanced mixer comprising a plurality of transistors, each transistor being adapted to operate in the microwave frequency range and including an input electrode, a control electrode, and an output electrode, said plurality of transistors being arranged in a ring configuration with the control electrodes of a first pair of said transistors being interconnected and the control electrodes of a second pair of said transistors being interconnected, circuitry for coupling an input signal having a frequency within a predetermined frequency band in the microwave frequency range to the input electrode of said ring of transistors and for producing a 180° relative phase difference between the input signal applied to the input electrodes of first transistors of the first and second pairs of transistors and the input signal applied to the input electrodes of second transistors of the first and second pairs of transistors, circuitry for coupling a local oscillator signal to the control electrodes of said ring of transistors and for producing a 180° relative phase difference between the local oscillator signal applied to the control electrodes of said first pair of transistors and the local oscillator signal applied to the control electrodes of said second pair of transistors, circuitry for applying a predetermined electrical potential to at least one of the control, input, or output electrodes of each one of said transistors to bias the plurality of transistors in their linear operating regions, transistors, and a local oscillator port adapted to receive the local oscillator signal as an unbalanced local oscillator signal, said local oscillator signal coupling circuitry including circuitry for transforming the unbalanced local oscillator signal to a balanced signal and for coupling a first component of said balanced local oscillator signal to the control electrodes of said first pair of transistors and a second component of said balanced local oscillator signal, 180° out of phase with the first component, to the control electrodes of said second pair of transistors, said transforming and coupling circuitry including circuitry for maintaining the 180° phase difference between the first and second local oscillator signal components over a predetermined local oscillator signal frequency band, whereby said ring of transistors produces at said output electrodes an output signal having a frequency which is a function of the frequencies of the input signal and the local oscillator signal for input signals within the predetermined frequency band, and circuitry for coupling said output signal from said output electrodes to an output port.

18. The mixer of claim 17 wherein said first strip conductor has a first end coupled to said local oscillator port and adapted to receive said unbalanced local oscillator signal and said second strip conductor has a first end coupled to said local oscillator port at a reference potential.

19. The mixer of claim 18 wherein said first strip conductor has a junction region at which said first strip conductor divides into a pair of conductors correspondingly coupled to the control electrodes of said first pair of transistors, and said second strip conductor has a junction region at which said second strip conductor splits into a pair of conductors correspondingly coupled to the control electrodes of said second pair of transistors.

20. The mixer of claim 19 wherein a first one of the pair of conductors of the first strip conductor and a first one of the pair of conductors of the second strip conductor are aligned and disposed in a first plane, and a second one of the pair of conductors of the first strip conductor and a second one of the pair of conductors of the second strip conductor are aligned and disposed in a second plane different from the first plane.

21. The mixer of claim 20 wherein the first end of the first strip conductor and the first end of the second strip conductor are aligned and disposed in the first plane.

22. The mixer of claim 19 wherein said first and second strip conductors are arranged to maintain a predetermined impedance along said strip transmission line between the first ends of the first and second strip conductors and the junction regions of said first and second strip conductors.

23. The mixer of claim 22 wherein said first strip conductor has a first, substantially constant width between its first end and its junction region, and said second strip conductor has a second, greater width at its first end and is tapered to the first width at its junction region to maintain said predetermined impedance between said first ends and said junction regions.

24. The mixer of claim 23 wherein the width of said second strip conductor is tapered along an exponential curve between its first end and its junction region.

25. The mixer of claim 22 wherein the pairs of conductors of said first and second strip conductors are arranged to provide a second impedance between said junction regions of said first and second strip conductors and the control electrodes of said transistors, said second impedance being matched to an input impedance at the control electrodes of said transistors.

26. The mixer of claim 1 wherein the output electrode of the first transistor of the first pair of transistors is coupled to the output electrode of the second transistor of the second pair of transistors and a third terminal, and the output electrode of the second transistor of the first pair of transistors is coupled to the output electrode of the first transistor of the second pair of transistors at a fourth terminal.

27. The mixer of claim 26 wherein said plurality of transistors are adapted to produce said output signal as a balanced signal across said third and fourth terminals, and further comprising circuitry for transforming the balanced signal to an unbalanced output signal and for coupling the unbalanced output signal to an output port.

28. The mixer of claim 27 wherein said transforming and coupling circuitry has a first impedance at the output electrodes of said transistors matched to an output impedance of said transistors, said transforming circuitry comprising circuitry for transforming the first impedance to a second impedance at the output port.

29. The mixer of claim 28 wherein said transforming circuitry comprises a discrete transformer.

30. The mixer of claim 1 wherein each said transistor comprises a metal electrode semiconductor field effect transistor (MESFET).

31. The mixer of claim 1 wherein each said transistor comprises a metal insulator semiconductor field effect transistor (MISFET).

32. The mixer of claim 1 wherein each said transistor comprises a high electron mobility transistor (HEMT)

33. The mixer of claims 30, 31, or 32 wherein said control electrodes comprise gate electrodes.

34. The mixer of claim 33 wherein said input electrodes comprise drain electrodes and said output electrodes comprise source electrodes.

35. The mixer of claim 33 wherein said input electrodes comprise source electrodes and said output electrodes comprise drain electrodes.

36. The mixer of claim 1 wherein said circuitry for applying said predetermined electrical potential to bias the plurality of transistors comprises part of said circuitry for coupling the local oscillator signal to the control electrodes of said ring of transistors.

37. The mixer of claim 36 wherein said local oscillator coupling circuitry comprises a strip transmission line including a pair of strip conductors separated by a dielectric substrate, said strip transmission line being adapted to derive a bias level for said plurality of transistors from the local oscillator signal.

38. The mixer of claim 37 further comprising a pair of discrete capacitors correspondingly connected in series with said pair of strip conductors for forming a bias circuit with an inductance of said strip transmission line to derive said bias level.

39. The mixer of claim 1 wherein said circuitry for applying said predetermined electrical potential to bias the plurality of transistors comprises a portion of said circuitry for coupling said output signal from the output electrodes to said output port.

40. The mixer of claim 41 wherein said output signal coupling circuitry comprises a transformer having a primary winding connected across said output electrodes of said plurality of transistors, said primary winding having a tap adapted to receive the derived bias voltage.

41. The mixer of claim 1 wherein said mixer further comprises circuitry for preventing said plurality of transistors from developing a DC current at their input electrodes in response to the biasing of said transistors.

42. The mixer of claim 41 wherein said input signal coupling circuitry comprises a strip transmission line including a pair of strip conductors separated by a dielectric substrate, said strip transmission line comprising circuitry for preventing said DC current.

43. The mixer of claim 42 wherein said circuitry for preventing the DC current comprises a pair of discrete capacitors correspondingly connected in series with said pair of strip conductors.

* * * * *